(12) United States Patent
Drzaic

(10) Patent No.: US 6,518,949 B2
(45) Date of Patent: *Feb. 11, 2003

(54) ELECTRONIC DISPLAYS USING ORGANIC-BASED FIELD EFFECT TRANSISTORS

(75) Inventor: Paul Drzaic, Lexington, MA (US)

(73) Assignee: E Ink Corporation, Cambridge, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/289,036

(22) Filed: Apr. 9, 1999

(65) Prior Publication Data

US 2002/0063677 A1 May 30, 2002

Related U.S. Application Data

(60) Provisional application No. 60/081,374, filed on Apr. 10, 1998, and provisional application No. 60/096,302, filed on Aug. 12, 1998.

(51) Int. Cl.⁷ .................................................. G09G 3/34
(52) U.S. Cl. .......................... 345/107; 257/40; 345/206
(58) Field of Search ................................ 345/107, 108, 345/105, 42, 85, 204, 205, 206; 257/40, 324

(56) References Cited

U.S. PATENT DOCUMENTS

| | | |
|---|---|---|
| 2,800,457 A | 7/1957 | Green et al. |
| 3,036,388 A | 5/1962 | Tate |
| 3,384,488 A | 5/1968 | Tulagin et al. |
| 3,406,363 A | 10/1968 | Tate |
| 3,460,248 A | 8/1969 | Tate |
| 3,585,381 A | 6/1971 | Hodson et al. |
| 3,612,758 A | 10/1971 | Evans et al. |
| 3,668,106 A | 6/1972 | Ota |
| 3,670,323 A | 6/1972 | Sobel et al. |
| 3,756,693 A | 9/1973 | Ota |

(List continued on next page.)

FOREIGN PATENT DOCUMENTS

| | | |
|---|---|---|
| EP | 0 186 710 A1 | 7/1986 |
| EP | 0 204 063 | 10/1987 |
| EP | 0 240 063 B1 | 10/1987 |
| EP | 0 268 877 | 6/1988 |
| EP | 0 281 204 A2 | 9/1988 |

(List continued on next page.)

OTHER PUBLICATIONS

Drzaic, P. et al., "A Printed and Rollable Bistable Electronic Display," SID International Symposium Digest of Technical Papers, vol. 29, May 17, 1998.

Toyama, J. et al., "An Electrophoretic Matrix Display with External Logic and Driver Directly Assembled to the Panel," SID International Symposium Digest of Technical Papers, vol. 25, Jun. 14, 1994.

Jackson, T. et al., "Organic Thin–Film Transistors for Organic Light–Emitting Flat–Panel Display Backplanes," IEEE Journal of Selected Topics in Quantum Electronics, vol. 4, No. 1, Jan. 1, 1998.

Sano, M., "Block Copolymer Epitaxy," Advanced Materials, DE, VCH Verlagsgesellschaft, Weinheim, vol. 9, No. 6, May 1, 1997, pp. 509–511.

(List continued on next page.)

Primary Examiner—Kent Chang
(74) Attorney, Agent, or Firm—Testa, Hurwitz & Thibeault, LLP

(57) ABSTRACT

A display comprises an encapsulated display media addressed by an organic-based field effect transistor. The display media comprises a plurality of particles and a fluid. The field effect transistor comprises an organic semiconductor.

55 Claims, 5 Drawing Sheets

U.S. PATENT DOCUMENTS

| | | |
|---|---|---|
| 3,767,392 A | 10/1973 | Ota |
| 3,772,013 A | 11/1973 | Wells |
| 3,792,308 A | 2/1974 | Ota |
| 3,806,893 A | 4/1974 | Ohnishi et al. |
| 3,850,627 A | 11/1974 | Wells et al. |
| 3,892,658 A | 7/1975 | Ota |
| 4,001,140 A | 1/1977 | Foris et al. |
| 4,041,481 A | 8/1977 | Sato |
| 4,045,327 A | 8/1977 | Noma et al. |
| 4,062,009 A | 12/1977 | Raverdy et al. |
| 4,068,927 A | 1/1978 | White |
| 4,071,430 A | 1/1978 | Liebert |
| 4,088,395 A | 5/1978 | Giglia |
| 4,093,534 A | 6/1978 | Carter et al. |
| 4,123,346 A | 10/1978 | Ploix |
| 4,126,528 A | 11/1978 | Chiang |
| 4,126,854 A | 11/1978 | Sheridon |
| 4,143,103 A | 3/1979 | Sheridon |
| 4,143,472 A | 3/1979 | Murata et al. |
| 4,147,932 A | 4/1979 | Lewis |
| 4,149,149 A | 4/1979 | Miki et al. |
| 4,166,800 A | 9/1979 | Foag |
| 4,203,106 A | 5/1980 | Dalisa et al. |
| 4,211,668 A | 7/1980 | Tate |
| 4,218,302 A | 8/1980 | Dalisa et al. |
| 4,231,641 A | 11/1980 | Randin |
| 4,261,653 A | 4/1981 | Goodrich |
| 4,272,596 A | 6/1981 | Harbour et al. |
| 4,273,672 A | 6/1981 | Vassiliades |
| 4,298,448 A | 11/1981 | Müller et al. |
| 4,305,807 A | 12/1981 | Somlyody |
| 4,311,361 A | 1/1982 | Somlyody |
| 4,314,013 A | 2/1982 | Chang |
| 4,324,456 A | 4/1982 | Dalisa |
| 4,368,952 A | 1/1983 | Murata et al. |
| 4,390,403 A | 6/1983 | Batchelder |
| 4,418,346 A | 11/1983 | Batchelder |
| 4,419,383 A | 12/1983 | Lee |
| 4,438,160 A | 3/1984 | Ishikawa et al. |
| 4,450,440 A | 5/1984 | White |
| 4,502,934 A | 3/1985 | Gazard et al. |
| 4,522,472 A | 6/1985 | Liebert et al. |
| 4,543,306 A | 9/1985 | Dubois et al. |
| 4,620,916 A | 11/1986 | Zwemer et al. |
| 4,643,528 A | 2/1987 | Bell, Jr. |
| 4,648,956 A | 3/1987 | Marshall et al. |
| 4,655,897 A | 4/1987 | DiSanto et al. |
| 4,707,080 A | 11/1987 | Fergason |
| 4,732,830 A | 3/1988 | DiSanto et al. |
| 4,742,345 A | 5/1988 | DiSanto et al. |
| 4,746,917 A | 5/1988 | DiSanto et al. |
| 4,748,366 A | 5/1988 | Taylor |
| 4,833,464 A | 5/1989 | DiSanto et al. |
| 4,846,931 A | 7/1989 | Gmitter et al. |
| 4,883,561 A | 11/1989 | Gmitter et al. |
| 4,889,603 A | 12/1989 | DiSanto et al. |
| 4,909,959 A | 3/1990 | Lemaire et al. |
| 4,919,521 A | 4/1990 | Tada et al. |
| 4,931,019 A | 6/1990 | Park |
| 4,947,219 A | 8/1990 | Boehm |
| 5,017,225 A | 5/1991 | Nakanishi et al. |
| 5,041,824 A | 8/1991 | DiSanto et al. |
| 5,053,763 A | 10/1991 | DiSanto et al. |
| 5,057,363 A | 10/1991 | Nakanishi |
| 5,059,694 A | 10/1991 | Delabouglise et al. |
| 5,066,105 A | 11/1991 | Yoshimoto et al. |
| 5,066,559 A | 11/1991 | Elmasry et al. |
| 5,066,946 A | 11/1991 | DiSanto et al. |
| 5,070,326 A | 12/1991 | Yoshimoto et al. |
| 5,077,157 A | 12/1991 | DiSanto et al. |
| 5,082,351 A | 1/1992 | Fergason |
| 5,105,185 A | 4/1992 | Nakanowatari et al. |
| 5,128,785 A | 7/1992 | Yoshimoto et al. |
| 5,132,049 A | 7/1992 | Garreau et al. |
| 5,138,472 A | 8/1992 | Jones et al. |
| 5,149,826 A | 9/1992 | Delabouglise et al. |
| 5,151,032 A | 9/1992 | Igawa |
| 5,174,882 A | 12/1992 | DiSanto et al. |
| 5,177,476 A | 1/1993 | DiSanto et al. |
| 5,185,226 A | 2/1993 | Grosso et al. |
| 5,187,609 A | 2/1993 | DiSanto et al. |
| 5,204,424 A | 4/1993 | Roncali et al. |
| 5,216,416 A | 6/1993 | DiSanto et al. |
| 5,223,115 A | 6/1993 | DiSanto et al. |
| 5,223,823 A | 6/1993 | DiSanto et al. |
| 5,247,290 A | 9/1993 | DiSanto et al. |
| 5,250,388 A | 10/1993 | Schoch, Jr. et al. |
| 5,250,932 A | 10/1993 | Yoshimoto et al. |
| 5,250,938 A | 10/1993 | DiSanto et al. |
| 5,254,981 A | 10/1993 | DiSanto et al. |
| 5,262,098 A | 11/1993 | Crowley et al. |
| 5,266,937 A | 11/1993 | DiSanto et al. |
| 5,268,448 A | 12/1993 | Buechner et al. |
| 5,270,843 A | 12/1993 | Wang |
| 5,276,438 A | 1/1994 | DiSanto et al. |
| 5,279,511 A | 1/1994 | DiSanto et al. |
| 5,279,694 A | 1/1994 | DiSanto et al. |
| 5,293,528 A | 3/1994 | DiSanto et al. |
| 5,294,820 A * | 3/1994 | Gemma et al. ............. 257/324 |
| 5,296,974 A | 3/1994 | Tada et al. |
| 5,298,833 A | 3/1994 | Hou |
| 5,302,235 A | 4/1994 | DiSanto et al. |
| 5,303,073 A | 4/1994 | Shirota et al. |
| 5,304,439 A | 4/1994 | DiSanto et al. |
| 5,315,312 A | 5/1994 | DiSanto et al. |
| 5,316,341 A | 5/1994 | Scwartz |
| 5,344,594 A | 9/1994 | Sheridon |
| 5,347,144 A | 9/1994 | Garnier et al. |
| 5,359,346 A | 10/1994 | DiSanto et al. |
| 5,360,689 A | 11/1994 | Hou et al. |
| 5,362,671 A | 11/1994 | Zavracky et al. |
| 5,380,362 A | 1/1995 | Schubert |
| 5,383,008 A | 1/1995 | Sheridon |
| 5,389,945 A | 2/1995 | Sheridon |
| 5,402,145 A | 3/1995 | DiSanto et al. |
| 5,403,515 A | 4/1995 | Instone et al. |
| 5,411,398 A | 5/1995 | Nakanishi et al. |
| 5,411,656 A | 5/1995 | Schubert |
| 5,421,926 A | 6/1995 | Yukinobu et al. |
| 5,460,688 A | 10/1995 | DiSanto et al. |
| 5,463,492 A | 10/1995 | Check, III |
| 5,467,107 A | 11/1995 | DiSanto et al. |
| 5,498,674 A | 3/1996 | Hou et al. |
| 5,508,068 A | 4/1996 | Nakano |
| 5,508,720 A * | 4/1996 | DiSanto et al. ............. 345/107 |
| 5,512,162 A | 4/1996 | Sachs et al. |
| 5,543,219 A | 8/1996 | Elwakil |
| 5,552,679 A | 9/1996 | Murasko |
| 5,556,583 A | 9/1996 | Tashiro et al. |
| 5,561,443 A | 10/1996 | DiSanto et al. |
| 5,565,885 A | 10/1996 | Tamanoi |
| 5,573,711 A | 11/1996 | Hou et al. |
| 5,574,291 A * | 11/1996 | Dodabalapur et al. ........ 257/40 |
| 5,582,700 A | 12/1996 | Bryning et al. |
| 5,583,675 A | 12/1996 | Yamada et al. |
| 5,596,208 A | 1/1997 | Dodabalapur et al. |
| 5,597,889 A | 1/1997 | Takimoto et al. |
| 5,604,027 A | 2/1997 | Sheridon |
| 5,604,070 A | 2/1997 | Rao et al. |
| 5,610,455 A | 3/1997 | Allen et al. |
| 5,614,340 A | 3/1997 | Bugner et al. |

| | | | |
|---|---|---|---|
| 5,625,199 A | 4/1997 | Baumbach et al. | |
| 5,627,561 A * | 5/1997 | Laspina et al. ............. 345/107 | |
| 5,635,317 A | 6/1997 | Taniguchi et al. | |
| 5,638,103 A | 6/1997 | Obata et al. | |
| 5,639,914 A | 6/1997 | Tomiyama et al. | |
| 5,643,673 A | 7/1997 | Hou | |
| 5,650,872 A | 7/1997 | Saxe et al. | |
| 5,654,367 A | 8/1997 | Takimoto et al. | |
| 5,659,181 A | 8/1997 | Bridenbaugh et al. | |
| 5,663,224 A | 9/1997 | Emmons et al. | |
| 5,672,381 A | 9/1997 | Rajan | |
| 5,673,148 A | 9/1997 | Morris et al. | |
| 5,676,884 A | 10/1997 | Tiers et al. | |
| 5,691,098 A | 11/1997 | Busman et al. | |
| 5,693,442 A | 12/1997 | Weiss et al. | |
| 5,693,977 A | 12/1997 | Haddon et al. | |
| 5,694,224 A | 12/1997 | Tai | |
| 5,705,826 A | 1/1998 | Aratani et al. | |
| 5,707,738 A | 1/1998 | Hou | |
| 5,707,747 A | 1/1998 | Tomiyama et al. | |
| 5,708,525 A | 1/1998 | Sheridon | |
| 5,709,976 A | 1/1998 | Malhotra | |
| 5,714,270 A | 2/1998 | Malhotra et al. | |
| 5,715,511 A | 2/1998 | Aslam et al. | |
| 5,716,550 A | 2/1998 | Gardner et al. | |
| 5,717,283 A | 2/1998 | Biegelsen et al. | |
| 5,717,514 A | 2/1998 | Sheridon | |
| 5,717,515 A | 2/1998 | Sheridon | |
| 5,725,935 A | 3/1998 | Rajan | |
| 5,729,632 A | 3/1998 | Tai | |
| 5,737,115 A | 4/1998 | Mackinlay et al. | |
| 5,739,801 A | 4/1998 | Sheridon | |
| 5,745,094 A | 4/1998 | Gordon, II et al. | |
| 5,751,268 A | 5/1998 | Sheridon | |
| 5,753,763 A | 5/1998 | Rao et al. | |
| 5,754,332 A | 5/1998 | Crowley | |
| 5,759,671 A | 6/1998 | Tanaka et al. | |
| 5,760,761 A | 6/1998 | Sheridon | |
| 5,767,826 A | 6/1998 | Sheridon et al. | |
| 5,777,782 A | 7/1998 | Sheridon | |
| 5,783,614 A | 7/1998 | Chen et al. | |
| 5,808,783 A | 9/1998 | Crowley | |
| 5,825,529 A | 10/1998 | Crowley | |
| 5,828,432 A | 10/1998 | Shashidhar et al. | |
| 5,843,259 A | 12/1998 | Narang et al. | |
| 5,900,858 A | 5/1999 | Richley | |
| 5,914,806 A | 6/1999 | Gordon, II et al. | |
| 5,930,026 A | 7/1999 | Jacobson et al. | |
| 5,936,259 A | 8/1999 | Katz et al. | |
| 5,969,376 A | 10/1999 | Bao | |
| 6,087,196 A * | 7/2000 | Sturm et al. .................. 438/29 | |
| 6,107,117 A * | 8/2000 | Bao et al. .................... 438/151 | |
| 6,118,426 A * | 9/2000 | Albert et al. ............. 345/107 | |
| 6,124,851 A * | 9/2000 | Jacobson .................... 345/206 | |
| 6,197,663 B1 * | 3/2001 | Chandross et al. ......... 438/455 | |

FOREIGN PATENT DOCUMENTS

| | | |
|---|---|---|
| EP | 0 323 656 | 7/1989 |
| EP | 0 325 013 A1 | 7/1989 |
| EP | 0 325 013 B1 | 7/1989 |
| EP | 0 361 420 A2 | 4/1990 |
| EP | 0 362 928 | 4/1990 |
| EP | 0 375 005 | 6/1990 |
| EP | 0 396 937 | 11/1990 |
| EP | 0 404 545 | 12/1990 |
| EP | 0 408 105 | 1/1991 |
| EP | 0 442 123 | 8/1991 |
| EP | 0 442 123 A1 | 8/1991 |
| EP | 0 443 571 A2 | 8/1991 |
| EP | 0 460 747 A2 | 12/1991 |
| EP | 0 525 852 | 2/1993 |
| EP | 0 537 240 | 4/1993 |
| EP | 0 540 281 A2 | 5/1993 |
| EP | 0 417 362 | 5/1995 |
| EP | 0 721 176 | 7/1996 |
| EP | 0 825 657 | 2/1998 |
| EP | 0 852 403 | 7/1998 |
| EP | 0 863 557 A2 | 9/1998 |
| EP | 0 930 641 A2 | 7/1999 |
| FR | 2 693 005 | 12/1993 |
| GB | 1 314 906 | 4/1973 |
| GB | 1 465 701 | 3/1977 |
| GB | 2 044 508 | 10/1980 |
| GB | 2 306 229 | 4/1997 |
| GB | 2 330 451 A | 4/1999 |
| JP | 53-73098 | 6/1978 |
| JP | 55096922 | 7/1980 |
| JP | 60189731 | 9/1985 |
| JP | 62058222 | 3/1987 |
| JP | 62231930 | 10/1987 |
| JP | 62269124 | 11/1987 |
| JP | 62299824 | 12/1987 |
| JP | 0186116 | 3/1989 |
| JP | 01086116 | 3/1989 |
| JP | 01086117 A | 3/1989 |
| JP | 01086118 | 3/1989 |
| JP | 64-86116 | 3/1989 |
| JP | 01142537 A | 6/1989 |
| JP | 01177517 | 7/1989 |
| JP | 01248182 A | 10/1989 |
| JP | 01267525 | 10/1989 |
| JP | 02223934 A | 9/1990 |
| JP | 02223935 A | 9/1990 |
| JP | 02223936 A | 9/1990 |
| JP | 02284124 A | 11/1990 |
| JP | 02284125 A | 11/1990 |
| JP | 5-61421 | 3/1993 |
| JP | 05165064 A | 6/1993 |
| JP | 05173194 A | 7/1993 |
| JP | 05307197 A | 11/1993 |
| JP | 6089081 | 3/1994 |
| JP | 6-202168 | 7/1994 |
| JP | 9-6277 | 1/1997 |
| JP | 950181574 | 2/1997 |
| JP | 9-185087 | 7/1997 |
| JP | 09230391 | 9/1997 |
| JP | 10-48673 | 2/1998 |
| JP | 10072571 A | 3/1998 |
| JP | 10135481 | 5/1998 |
| JP | 10142628 | 5/1998 |
| JP | 10-149118 | 6/1998 |
| JP | 10-161116 | 6/1998 |
| JP | 1019001 | 7/1998 |
| JP | 11195790 A | 7/1999 |
| WO | WO 82/02961 | 9/1982 |
| WO | WO 90/08402 | 7/1990 |
| WO | WO 92/12453 | 7/1992 |
| WO | WO 92/17873 | 10/1992 |
| WO | WO 92/20060 | 11/1992 |
| WO | WO 93/18428 | 9/1993 |
| WO | WO 94/24236 | 10/1994 |
| WO | WO 95/02636 | 1/1995 |
| WO | WO 95/05622 | 2/1995 |
| WO | WO 95/15363 | 6/1995 |
| WO | WO 95/19227 | 7/1995 |
| WO | WO 95/27924 | 10/1995 |
| WO | WO 95/33085 | 12/1995 |
| WO | WO 96/17102 | 6/1996 |
| WO | WO 96/41372 | 12/1996 |
| WO | WO 97/04398 | 2/1997 |
| WO | WO 97/35298 | 9/1997 |
| WO | WO 97/49125 | 12/1997 |

| | | |
|---|---|---|
| WO | WO 98/03896 | 1/1998 |
| WO | WO 98/12585 | 3/1998 |
| WO | WO 98/19208 | 5/1998 |
| WO | WO 98/41898 | 9/1998 |
| WO | WO 98/41899 | 9/1998 |
| WO | WO 98/55897 | 12/1998 |
| WO | WO 98/58383 | 12/1998 |
| WO | WO 99/10939 | 3/1999 |
| WO | WO 99/12170 | 3/1999 |
| WO | WO 99/14762 | 3/1999 |
| WO | WO 99/14763 | 3/1999 |
| WO | WO 99/26419 | 5/1999 |
| WO | WO 99/04631 | 8/1999 |
| WO | WO 99/40631 | 8/1999 |
| WO | WO 99/44582 | 9/1999 |
| WO | WO 99/45416 | 9/1999 |
| WO | WO 99/63527 | 12/1999 |
| WO | WO 99/65011 | 12/1999 |
| WO | WO 99/65012 | 12/1999 |

OTHER PUBLICATIONS

Wong, T.K.S., et al., "Patterning of Poly(3–alkylthiophene) Thin Films by Direct–Write Ultraviolet Laser Lithography," Materials Science and Engineering B, CH, Elsevier Sequoia, Lausanne, vol. 55, No. 1–2, Aug. 14, 1998, pp. 71–78.

Hebner, T.R., et al., "Ink–Jet Printing of Doped Polymers for Organic Light Emitting Devices," Applied Physics Letters, American Institute of Physics, New York, U.S., vol. 72, No. 5, Feb. 2, 1998.

Bao et al., "Soluble and processable regioregular poly(3–hexylthiophene) for thin film field–effect transistor applications with high mobility," American Institute of Physics, vol. 69, No. 26, Dec. 23, 1996, pp. 4108–4110.

Bao et al., "High–Performance Plastic Transistors Fabricated by Printed Techniques," Chemical Matter, vol. 9, 1997, pp. 1299–1301.

Dodabalapur et al., "Organic Smart Pixels," American Institute of Physics, 1998, pp. 142–144.

Torsi et al., "Organic Thin–Film–Transistors With High On/Off Ratios," Materials Research Society Symoposium Proceeding, vol. 377, 1995, pp. 895–700.

Horowitz, "Organic Field–Effect Transistors," Advanced Materials, vol. 10, No. 5, 1998, pp. 365–377.

McCullough, "The Chemistry of Conducting Polythiophenens," Advanced Materials, vol. 10, No. 2, 1998, pp. 93–116.

Kenward, "Displaying a Winning Glow," Technology Review, Jan./Feb. 1999, pp. 69–73.

Clarisse et al., "Field Effect Transistor with Diphthalocyanine Thin Film," Electronics Letters, vol. 24, No. 11, May 1998, pp. 674–675.

Comiskey et al., "Late–News Paper Electophoretic Ink: A Printable Display Material," SID 97 Digest, May 13, 1997, pp. 75.

Dobson, "Electronic Book is a Whole Library," The Sunday Times, Feb. 25, 1996.

Zollinger, "Structures of Simple Di–and Triarylmethine Dyes," Color Chemistry: Syntheses, Properties and Applications of Organic Dyes and Pigments, 2$^{nd}$ Revised Edition, 1991, p. 73.

M.H. Gutcho, "Pigments and Paints," Microcapsules and Microencapsulation Techniques, 1976, pp. 178–193.

Bohnke et al., "Polymer–Based Solid Electrochromic Cell for Matrix–Addressable Display Devices," J. Electronchem. Soc., vol. 138, No. 121, Dec. 1991, pp. 3612–3617.

Murau, "Characteristics of an X–Y Addressed Electrophorectic Image Display (EPID)," SID 84 Digest, 1984, pp. 141.

Garnier et al., "All–Polymer Field–Effect Transistor Realized by Printing Techniques," Sep. 16, 1994, vol. 265, pp. 1684–1686.

Lu et al., "Studies of Polymer–Based Field Effect Transistors," Sep. 1993, vol. 2, pp. 814–816.

Masui et al., "Effect of Crystallinity on Electrical Conductivity of Alpha CU–Phthalocyanin Film," May 1, 1992, vol. 112A, No. 5, pp. 371–374.

Nakamura et al., "Development of Electrophoretic Display Using Microencapsulated Suspension," 1998 ISD International Symposium Digust of Technical Papers. vol. 29, Proceedings of SID '98 International Symposium, Anaheim, CA, USA, May 1998, pp. 1014–1017.

Sankus, "Electrophoretic Display Cell," Xerox Disclosure Journal, vol. 4, No. 3, May/Jun. 1979, pp. 309.

"Mciroencapsulation with Synthetic Polymeric Film Formers," Microcapsules and Microencapsulation Techniques, 1976, pp. 65–130.

Ballinger et al., "Magnetic Recording Paper is Erasable," Electronics, Mar. 1, 1973, pp. 73–76.

Beilin et al, "2000–Character Electophoretic Display," SID 86 Digest, 1986, pp. 136–140.

Chiang, "Conduction Mechanism of Charge Control Agents Used in Electrophoretic Display Devices," Proceeding of the SID 18, vol. 18, Nos. 3 & 4, 1977, pp. 275–282.

Clarisse, "A High Speed Electrophoretic Matrix Display," SID 80 Digest, 1980, pp. 114–115.

Dalisa "Electrophoretic Display Technology," Transactions on Electron Devices, vol. 24, No. 7, Jul. 1977, pp. 827–834.

Egashira et al., "A Solid Electrochromic Cell Consisting of Lu–Diphthaocyanine and Lead Fluoride," Proceeding of the SID, vol. 28, No. 3, 1987, pp. 227–232.

Fitzhenry, "Optical Effects of Adsorption of dyes on Pigment Used in Electrophoretic Image Displays," Applied Optics, vol. 18, No. 19, Oct. 1979, pp. 3332–3337.

Fitzhenry–Ritz, "Optical Properties of Electrophorectic Image Displays," Proceeding of the SID, vol. 22, No. 4, 1981, pp. 300–309.

Goodman, "Passive Liquid Displays: Liquid Crystals, Electrophoretics, and Electrochromics," Proceeding of the SID, vol. 17, No. 1, 1976, pp. 30–38.

Gutcho, "Additional Uses for Encapsulated Products," Microcapsules and Microencapsulation Techniques, 1976, pp. 279–343.

Hatano et al., (1996), "Bistable Paper–White Display Device Using Cholesteric Liquid Crystals" SID 96 Digest, 1996, pp. 269–272.

Jin et al., "Optically Transparent, Electrically Conductive Composite Medium," Science, vol. 255, Jan. 24, 1992, pp. 446–448.

Lewis et al., "Gravitational, Inter–Particle and Particle–Electrode Forces in the Electrophoretic Display," Proceeding of the SID, vol. 18, Nos. 3 & 4, 1977, pp. 235–242.

Mürau et al., "The Understanding and Elimination of Some Suspension Instabilities in an Electrophoretic Display," Journal of Applied Physics, vol. 49, No. 9, 1978, pp. 4820–4829.

Vaz et al., "Dual Frequency Addressing of Polymer–Dispensed Liquid–Crystal Films," Journal of Applied Physics, vol. 65, No. 12, Jun. 15, 1989, pp. 5043–5049.

Ota et al., "Developments in Electrophoretic Displays," *Proceedings of the SID*, vol. 18, Nos. 3 & 4, 1977, pp. 243–254.

Ota et al., "Electrophoretic Image Display (EPID) Panel," *Processing of the IEEE*, 1973, pp. 1–5.

Ota et al., "Electrophoretic Display Devices," *Laser 75 Optoelectronics Conference Proceedings*, pp. 145–148.

Pearlstein, "Electroless Plating," *Modern Electroplating*, pp. 710–747.

Sheridon et al., "The Gyricon–A Twisting Ball Display," *Proceeding of the SID*, 1977, vol. 18, Nos. 3 and 4, pp. 289–293.

Shiwa. S. et al., "Electrophoretic Display Method Using Ionographic Technology," *SID 88 Digest*, 1988, pp. 61–62.

Singer et al., "An X–Y Addressable Electrophoretic Display," *Proceeding of the SID*, vol. 18, Nos. 3 & 4, 1977, pp. 255–266.

Yang et al., "A New Architecture for Polymer Transistors," *Nature*, vol. 372, Nov. 24, 1994, pp. 344–346.

Flaherty, "What Did Disappearing Ink Grow Up to Be ?Electronic Ink," *The New York Times*, May 6, 1999.

Negroponte et al., "Surfaces and Displays," *Wired*, Jan. 1997, pp. 212.

Comiskey et al, "An Electrophoretic Ink for All–Printed Reflective Electronic Displays," *Nature*, vol. 394, Jul. 16, 1998, pp. 253–255.

Zurer, "Digital Ink Brings Electronic Books Closer," *Chemical*, Jul. 20, 1998, pp. 12–13.

Peterson, "Rethinking Ink. Printing the Pages of an Electronic Book," *Science News*, vol. 153, Jun. 20, 1998, pp. 396–397.

Guernsey, "Beyond Neon: Electronic Ink," *New York Times*, Jun. 3, 1999, pp. 11.

White, "An Electrophoretic Bar Graph Display," *Proceedings of the SID*, vol. 22, No. 3, 1981, pp. 173–180.

Pansu et al., "Structures of Thin Layers of Hard Spheres: High Pressure Limit," *J. Physique*, vol. 45, Feb. 1984, pp. 331–339.

Peiranski et al., Thin Colloidal Crystals, *Physical Review Letters*, vol. 50, Nos. 12, Mar. 21, 1983, pp. 900–903.

Pansu et al., "Thin Colloidal Crystals: A Series of Structural Transitions," *J. Physique*, vol. 44, Apr. 1983, pp. 531–536.

Van Winkle et al., "Layering Transitions in Colloidal Crystals as Observed by Diffraction adn Direct–Lattice Imaging," *Physical Review* , vol. 34, No. 1, Jul. 1986, pp. 562–573.

Mürau et al., "An Electrophoretic Radiographic Device," *SID 79 Digest*, 1979, pp. 46–47/.

Blazo, S.F. "High Resolution Electrophoretic Display with Photoconductor Addressing" *SID 82 Digest* , 1982, pp. 92–93.

Bryce, "Seeing Through Synthetic Metals," *Nature*, vol. 335, No. 6185, Sep. 1, 1988, pp. 12–13.

Croucher et al., "Electrophoretic Display: Materials as Related To Performance," *Photographic Science and Engineering*, vol. 25, No. 2, 1981, pp. 80–86.

Ji et al, "P–50: Polymer Walls in Higher–Polymer–Content Bistable Refelctive Cholesteric Displays," *SID 96 Digest*, 1996, pp. 611–613.

Lee, "Fabrication of Magnetic Particles Display," *Proceeding of the S.I.D.*, vol. 18, Nos. 3 & 4, 1977, pp. 283–288.

Pankove, "Color Refelction Type Display Panel," *RCA Technical Notes*, No. 535: Mar. 1962, pp. 1–2.

Saitoh, M. et al., "A Newly Developed Electrical Twisting Ball Display," *Proceeding of the SID* , vol. 23, No. 4, 1982, pp. 249–253.

Shiffman et al., "An Electrophoretic Image Display with Internal NMOS Address Logic and Display Drivers," *Proceeding of the SID*, vol. 25, No. 2, 1984, pp. 105–115.

Vance, "Optical Characteristics of Electrophoretic Displays," *Proceeding of the SID*, vol. 18, Nos. 3 and 4, 1977, 267–274.

Yamaguchi et al., "Equivalet Circuit of Ion Projection–Driven Electrophoretic Display," *IEICE Transaction*, vol. 74, No. 12, 1991, pp. 4152–4156.

"Electronic Ink' Sign Debuts at JC Penney," *Boston Globe*, May 4, 1999.

Bonse et al., "Integrated a–Si:H/Pentacene Inorganic/Organic Complemetary Circuits," International Electron Devices Meeting, San Francisco, California, December 6–9, 1998, *IEDM Technical Digest*, 1998, pp. 248–252.

* cited by examiner

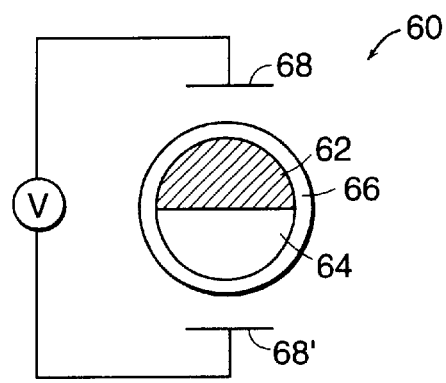
FIG. 3
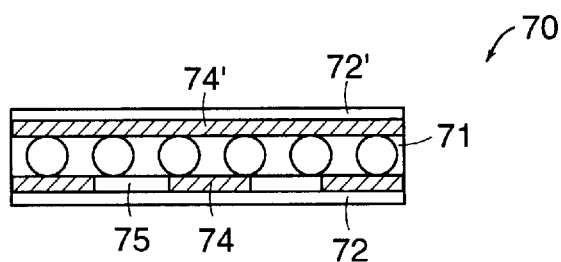
FIG. 4
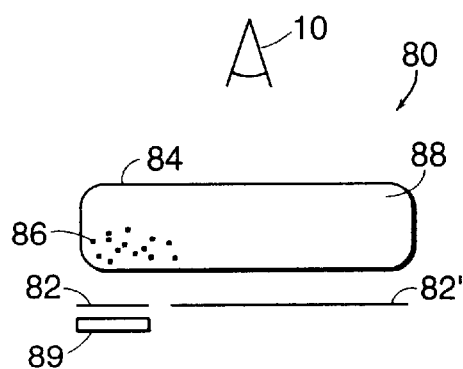 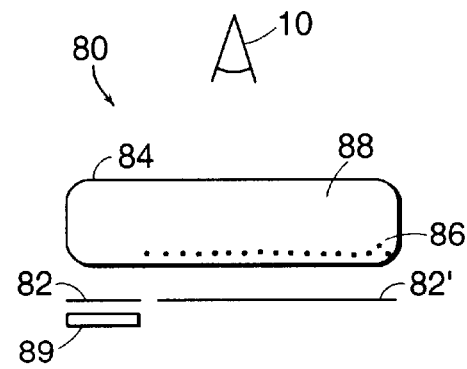
FIG. 5a             FIG. 5b

ELECTRONIC DISPLAYS USING ORGANIC-BASED FIELD EFFECT TRANSISTORS

RELATED APPLICATIONS

This invention claims priority to provisional applications U.S. Ser. No. 60/081,374 filed on Apr. 10, 1998 and U.S. Ser. No. 60/096,302 filed on Aug. 12, 1998.

FIELD OF THE INVENTION

This invention generally relates to electronic displays and more specifically to electronic displays addressed by organic-based field effect transistors.

BACKGROUND OF THE INVENTION

Microencapsulated, particle-based displays can be made highly reflective, bistable, and optically and electrically efficient. To obtain a high resolution display, however, individual pixels of a display must be addressable without interference from adjacent pixels. One way to achieve this objective is to provide an array of nonlinear transistor elements, where one transistor is associated with each pixel. The addressing electrodes are connected to the pixel through the transistor.

Most examples of nonlinear elements to date have been fabricated using vacuum-deposited silicon on glass. This process is costly in addition to being complex. The complexity prevents large area devices from being readily constructed. In addition, it is difficult to create silicon transistors on plastic or other flexible film.

Recently, there has been significant development in the area of organic semiconducting polymers and molecules. Thin film transistors have been made out of semiconducting polymers. See Bao et al., *Soluble and Processable Regioregular Poly(3-hexylthiophene) for Thin Film Field-Effector Transistor Applications with High Mobility*, Appl. Phys. Lett. 69(26), 4108 (December 1996); and Bao et al., *High-Performance Plastic Transistors Fabricated by Printing Techniques*, Chem. Mater. 1997, 9, 1299. U.S. Pat. No. 5,574,291 describes addressing liquid crystal displays with transistors made out of semiconducting polymers. While remarkable advances have been made in the performance of organic-based transistors, the mobility characteristics of many organic semiconductor materials and devices are insufficient to successfully drive many types of liquid crystal or emissive displays. Therefore, many organic-based transistors are not suitable for use with liquid crystal displays.

In addition, liquid crystals can degrade the transistors when they come in contact with the transistors. Many organic semiconductor materials can be swollen by, or dissolved by, liquid crystalline fluids because those fluids are good solvents. This solvent compatibility makes it challenging to design systems in which organic transistor devices can remain stable while in contact with or close proximity to liquid crystalline solvents, limiting their viability.

SUMMARY OF THE INVENTION

In one aspect, the invention features a display. The display comprises an encapsulated display media and an organic-based field effect transistor. The display media comprises a plurality of particles and a fluid, the display media has a first surface and a second surface. The organic-based field effect transistor comprises an organic semiconductor. The organic-based field effect transistor is disposed adjacent the second surface of the display media for addressing the display media. The display media can comprise a plurality of microencapsulated electrophoretic particles, suspended particles, or rotating balls.

In one embodiment, the organic semiconductor of the transistor comprises a polymeric and/or oligomeric semiconductor. For example, the polymeric semiconductor can comprise polythiophene, poly(3-alkyl)thiophene, alkyl-substituted oligothiophene, polythienylenevinylene, or poly(para-phenylenevinylene). For example, the oligomeric semiconductor can comprise alpha-hexathienylene. In another embodiment, the organic semiconductor can be selected from a group consisting of pentacene, phthalocyanine, benzodithiophene, fullerene, buckminsterfullerene, tetracyanonaphthoquinone, and tetrakisimethylanimoethylene, and derivatives.

In one embodiment, the display further comprises a barrier layer disposed adjacent at least a portion of the organic-based field effect transistor. In one detailed embodiment, the display comprises a plurality of pixel electrodes disposed adjacent the second surface of the display media and an array of transistors, each transistor protected with a barrier layer disposed adjacent the transistor. In another detailed embodiment, the display comprises an array of transistors encapsulated in a barrier capsule and disposed adjacent the second surface of the display media such that each transistor is connected to a pixel electrode.

The barrier layer or capsule can comprise a metal film, a metal oxide coating, a polymeric coating or a combination of these materials. In particular, a barrier layer or capsule comprising a metal film will also comprise an insulating coating to prevent unwanted electrical connections between the barrier capsule or layer and the transistor. The barrier layer or capsule can protect the transistor from light such as visible light or ultraviolet light. The barrier layer or capsule can protect the transistor from oxygen or moisture. In addition, the barrier layer or capsule can protect the transistor from solvents or other chemicals. In another embodiment, the organic-based field effect transistors are disposed on a substrate. The substrate can be opaque. The substrate can protect the transistors from oxygen or moisture.

In another aspect, the invention features a method of manufacturing a display. The method comprises the steps of: (a) providing an encapsulated display media comprising a plurality of particles and a fluid, the display media having a first surface and a second surface; and (b) providing an organic-based field effect transistor array comprising an organic semiconductor adjacent the second surface of the display media.

In one embodiment, step a) comprises providing an encapsulated display media on a first substrate; and step b) comprises (b1) providing an organic-based field effect transistor array on a second substrate, and (b2) combining the display media and the organic-based field effect transistor array to form the display.

In one embodiment, step (b) comprises printing the organic-based field effect transistor array. In one detailed embodiment, step (b) comprises printing the organic-based field effect transistor array using a solvent assisted printing step. In one embodiment, step (a) comprises providing a display media comprising microencapsulated electrophoretic particles, suspended particles, or rotating balls.

In another embodiment, step (b) comprises providing an organic-based field effect transistor array comprising a polymeric or oligomeric semiconductor. For example, the polymeric semiconductor can comprise polythiophene, poly(3-alkyl)thiophene, alkyl-substituted oligothiophene, polythienylenevinylene, or poly(para-phenylenevinylene). For example, the oligomeric semiconductor can comprise alpha-hexathienylene. In another embodiment, the organic semiconductor is selected from a group consisting of pentacene, phthalocyanine, benzodithiophene, fullerene, buckminsterfullerene, tetracyanonaphthoquinone, and tetrakisimethylanimoethylene.

In another embodiment, step (b) comprises (b1) providing an organic-based field effect transistor array, and (b2) providing a barrier layer over each organic-based field effect transistor of the array to protect the transistor. In another embodiment, step (a) comprises (a1) providing a display media and (a2) providing a plurality of pixel electrodes adjacent the second surface of the display media; and step (b) comprises (b1) encapsulating the transistor array in a barrier capsule and step (b2) disposing the encapsulated transistor array adjacent the display media such that each transistor is disposed adjacent a pixel electrode. The barrier layer or capsule can comprise a metal film, a metal oxide coating, or a polymeric coating. The barrier layer or capsule can protect the transistor from light such as visible light or ultraviolet light. The barrier layer or capsule can protect the transistor from oxygen or moisture. The barrier layer or capsule can further protect the transistor from a solvent.

In another embodiment, step (b) comprises providing an organic transistor array by evaporating the organic semiconductor. In another embodiment, step (b) comprises providing an organic transistor array by solvent coating an insulator of the transistors. In still another embodiment, step (b) comprises providing an organic transistor array by evaporating conductive leads to the transistors.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which:

FIG. 3 shows a cross section view of a bichromal sphere according to one embodiment of the present invention.

FIG. 4 shows a cross section view of a means for addressing an electronic display according to one embodiment of the present invention.

FIGS. 5a and 5b show cross section views of a means for addressing an electronic display according to another embodiment of the present invention.

DETAILED DESCRIPTION OF PREFERRED EMBODIMENTS

Figure 1A:
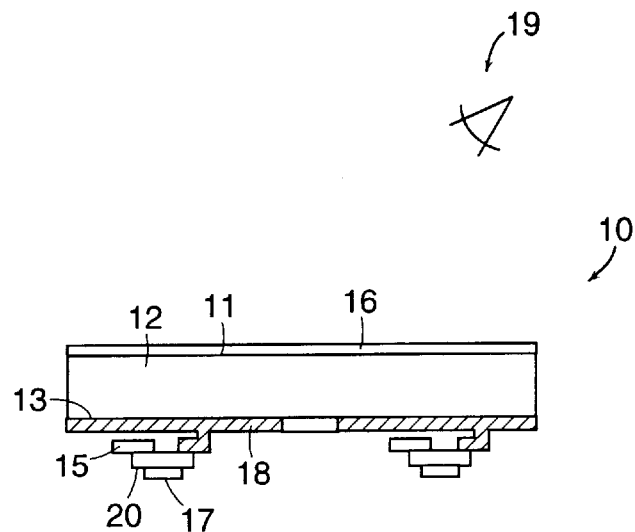
FIG. 1a shows a cross section view of an electronic display according to one embodiment of the present invention.

Referring to FIG. 1a, an electronic display 10 includes a display media 12, a first electrode 16, a second electrode 18, an array of transistors 20, an array of row electrodes 17, and an array of column electrodes 15. The first electrode 16 is disposed on a first surface 11 of the display media 12. In one embodiment, the first electrode 16 comprises a transparent, continuous electrode. The second electrode 18 disposed on a second surface 13 of the display media 12 comprises an array of patterned pixel electrodes 18. Each patterned electrode 18 defines a pixel of the display 10. The transistors 20 are located underneath the pixel electrodes 18. Each transistor 20 is electrically connected to a pixel electrode 18 to address a pixel. A row electrode 17 is electrically connected to all the transistors 20 in that row. A column electrode 15 is electrically connected to all the transistors 20 in that column.

In the embodiment of FIG. 1a, the transistors 20 are located on the backside of the display 10 from the standpoint of the viewer 19. Alternatively, the transistors 20 can be located on the front side of the display 10. In this embodiment, transparent pixel electrodes would be positioned on the first surface 11 of the display media 12, while the continuous electrode would be positioned on the second surface 13 of the display media 12. The continuous electrode need not be transparent.

In one embodiment, the electronic display 10 can be reflective. In this embodiment, the size of the transistors 20 positioned on the backside of the display 10 does not affect the ability of the viewer 19 to view the display 10. Therefore, the size of the transistor 20 can be determined based on manufacturing considerations and transistor performance. The size of the transistor 20 can be in the range from about 1% to about 100% of the area of the pixel the transistor 20 addresses. In another embodiment, the electronic display 10 can be transmissive. In this embodiment, the transistors 20 can impede the ability of the viewer 19 to view the display 10. Therefore, the transistors 20 are made as small as possible. In one embodiment, the size of the transistor 20 is less than 50% of the area of the pixel addressed by the transistor 20. In a preferred embodiment, the size of the transistor 20 is less than 20% of the area of the pixel addressed by the transistor 20. In a more preferred embodiment, the size of the transistor 20 is less than 5% of the area of the pixel addressed by the transistor 20.

Figure 1B:
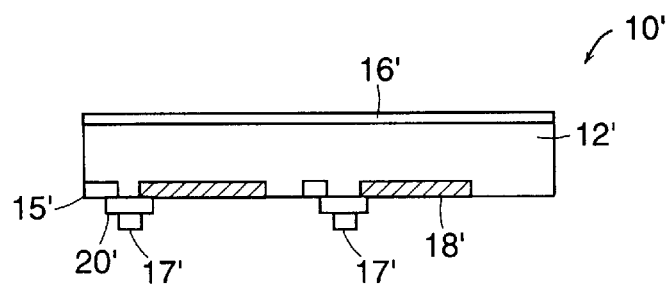
FIG. 1b shows a cross section view of an electronic display according to another embodiment of the present invention.
Figure 1C:
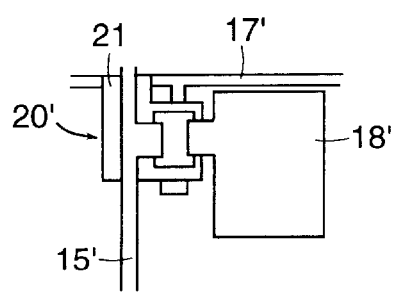
FIG. 1c shows a top view of the electronic display of FIG. 1b with the display media and the first electrode removed.

Referring to FIGS. 1b and 1c, an electronic display 10' includes a display media 12' having a plurality of pixels defined by the second electrodes 18'. The display 10' further includes the first electrode 16', the transistors 20', the row electrodes 17', the column electrodes 15', and an insulator 21. In this embodiment, the transistors 20' are positioned adjacent the pixel electrodes 18'.

In one embodiment, the display media 12 comprises a particle-based display media. In one detailed embodiment, the particle-based display media comprises an electronic ink. An electronic ink is an optoelectronically active material which comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include conducting or semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

Figure 2A:
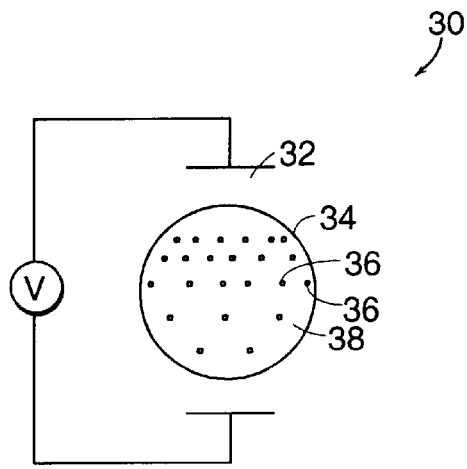
FIG. 2a shows a cross section view of an electronic ink according to one embodiment of the present invention.

FIG. 2a shows an electrophoretic display 30. The binder 32 includes at least one capsule 34, which is filled with a plurality of particles 36 and a dyed suspending fluid 38. In one embodiment, the particles 36 are titania particles. When a direct-current electric field of the appropriate polarity is applied across the capsule 34, the particles 36 move to the viewed surface of the display and scatter light. When the applied electric field is reversed, the particles 36 move to the rear surface of the display and the viewed surface of the display then appears dark.

Figure 2B:
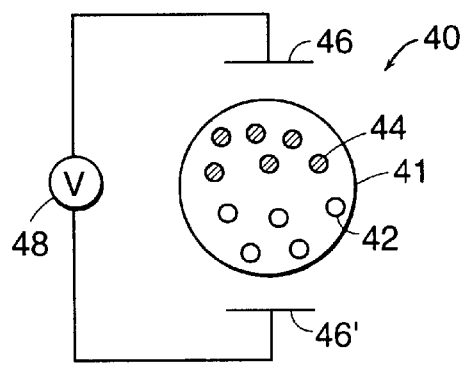
FIG. 2b shows a cross section view of an electronic ink according to another embodiment of the present invention.

FIG. 2b shows another electrophoretic display 40. This display comprises a first set of particles 42 and a second set of particles 44 in a capsule 41. The first set of particles 42 and the second set of particles 44 have contrasting optical properties. For example, the first set of particles 42 and the second set of particles 44 can have differing electrophoretic mobilities. In addition, the first set of particles 42 and the second set of particles 44 can have contrasting colors. For example, the first set of particles 42 can be white, while the second set of particles 44 can be black. The capsule 41 further includes a substantially clear fluid. The capsule 41 has electrodes 46 and 46' disposed adjacent it. The electrodes 46, 46' are connected to a source of voltage 48, which may provide an alternating-current (AC) field or a direct-current (DC) field to the capsule 41. Upon application of an electric field across the electrodes 46, 46', the first set of particles 42 move toward electrode 46', while the second set of particles 44 move toward electrode 46.

Figure 2C:
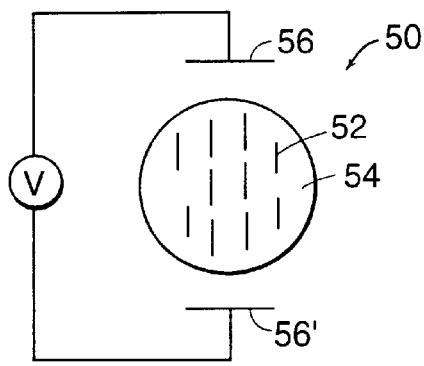
FIG. 2c shows a cross section view of an electronic ink according to another embodiment of the present invention.

FIG. 2c shows a suspended particle display 50. The suspended particle display 50 includes needle-ike particles 52 in a transparent fluid 54. The particles 52 change their orientation upon application of an AC field across the electrodes 56, 56'. When the AC field is applied, the particles 52 are oriented perpendicular with respect to the display surface and the display appears transparent. When the AC field is removed, the particles 52 are randomly oriented and the display 50 appears opaque.

The electrophoretic displays provided in FIGS. 2a-2c are exemplary only, and other electrophoretic displays can be used in accordance with the present invention. Other examples of electrophoretic displays are described in commonly owned, copending U.S. patent application Ser. Nos. 08/935,800 and 09/140,792 which are incorporated herein by reference.

In another detailed embodiment, the display media 12 can comprise a plurality of bichromal spheres shown in FIG. 3. A bichromal sphere 60 typically comprises a positively charged hemisphere 62 of a first color and a negatively charged hemisphere 64 of a second color in a liquid medium 66. Upon application of an electric field across the sphere 60 through a pair of electrodes 68, 68', the sphere 60 rotates and displays the color of one of the two hemispheres 62, 64.

An electronic display can be addressed in a variety of ways. In one embodiment, the display media 71 is sandwiched between two pieces of glass 72, 72' as shown in FIG. 4. Each piece of glass has an etched, clear electrode structure 74, 74' formed using indium tin oxide. The first electrode 74 controls the pixels of the display 70 that may be addressed, that is changed from one visible state to another. A second electrode 74', sometimes called a counter electrode, addresses all the display pixels as one large electrode, and is generally designed so that the placement of the rear electrode wire connections do not produce any unwanted visible changes in the appearance of the display medium. In this embodiment, the transistors 75 are connected to the first electrodes 74. Alternatively, the second electrode 74' can also be patterned to control specific segments of the displays 70.

An alternate means for addressing an encapsulated electrophoretic display (or other display) structure is also described in FIGS. 5a and 5b. In this embodiment, electrodes 82, 82' are disposed on only one side of a display 80, allowing the display 80 to be rear-addressed without a front electrode. Utilizing only one side of the display 80 for electrodes 82, 82' simplifies fabrication of displays 80. For example, if the electrodes 82, 82' are disposed on only the rear side of a display 80, both of the electrodes 82, 82' can be fabricated using opaque materials, because the electrodes 82, 82' do not need to be transparent.

FIG. 5a depicts a single capsule 84 of an encapsulated display media. In brief overview, the embodiment depicted in FIG. 5a includes a capsule 84 containing at least one particle 86 dispersed in a suspending fluid 88. The capsule 84 is addressed by a first electrode 82 and a second electrode 82'. The first electrode 82 is smaller than the second electrode 82'. The first electrode 82 and the second electrode 82' may be set to voltage potentials which affect the position of the particles 86 in the capsule 84. A transistor 89 is connected to the first electrode 82.

The electrodes 82, 82' should be sized and positioned appropriately so that together they address the entire capsule 84. There may be exactly one pair of electrodes 82, 82' per capsule 84, multiple pairs of electrodes per capsule 84, or a single pair of electrodes may span multiple capsules 84. In the embodiment shown in FIGS. 5a and 5b, the capsule 84 has a flattened, rectangular shape. In these embodiments, the electrodes 82, 82' should address most, or all, of the flattened surface area adjacent the electrodes 82, 82'. The smaller electrode 82 is at most one-half the size of the larger electrode 82'. In preferred embodiments the smaller electrode 82 is one-quarter the size of the larger electrode 82'; in more preferred embodiments the smaller electrode 82 is one-eighth the size of the larger electrode 82'. In even more preferred embodiments, the smaller electrode 82 is one-sixteenth the size of the larger electrode 82'. It should be noted that reference to "smaller" in connection with the electrode 82 means that the electrode 82 addresses a smaller amount of the surface area of the capsule 84, not necessarily that the electrode 82 is physically smaller than the larger electrode 82'. For example, multiple capsules may be positioned such that less of each capsule is addressed by the "smaller" electrode, even though both electrodes are equal in size.

Electrodes may be fabricated from any material capable of conducting electricity so that electrode 82, 82' may apply an electric field to the capsule 84. As noted above, the rear-addressed embodiments depicted in FIGS. 5a and 5b allow the electrodes 82, 82' to be fabricated from opaque materials such as solder paste, copper, copper-clad polyimide, graphite inks, silver inks and other metal-containing conductive inks. Alternatively, electrodes may be fabricated using transparent materials such as indium tin oxide and conductive polymers such as polyaniline or polythiophenes. Electrodes 82, 82' may be provided with contrasting optical properties. In some embodiments, one of the electrodes has an optical property complementary to optical properties of the particles 86.

The means of addressing an electronic display provided in FIG. 4, and FIGS. 5a and 5b are exemplary only. Other means of addressing an electronic display can be used in accordance with the present invention. Other means of addressing an electronic display are described in commonly-owned, copending U.S. patent application Ser. No. 09/141,280, which is incorporated herein by reference.

Figure 6A:
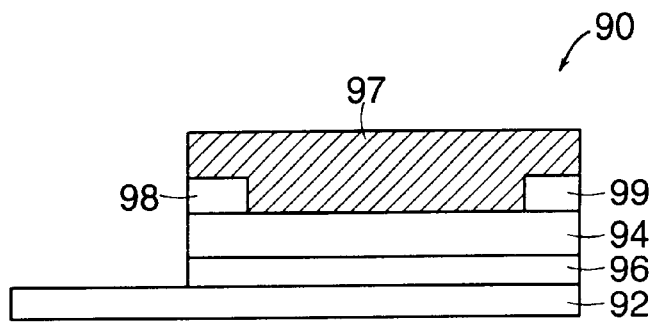
FIG. 6a shows a cross section view of an organic-based field effect transistor according to one embodiment of the present invention.

Referring to FIG. 6a, the transistor 90 comprises an organic-based field effect transistor. An organic-based field effect transistor 90 includes a substrate 92, a gate electrode 96 disposed adjacent the substrate 92, a dielectric layer 94 disposed adjacent the gate electrode 96, an organic semiconductor 97 disposed adjacent the dielectric layer 94, and a source electrode 98 and a drain electrode 99 disposed adjacent the dielectric layer 94 and in contact with the semiconductor layer 97. The substrate 92, for example, can comprise an insulator such as undoped silicon, glass, or plastic. Alternatively, the substrate can be patterned to serve as an electrode, which can be in electrical connection with a pixel electrode, or itself serve as the pixel electrode. The gate electrode 96, the source electrode 98, and the drain electrode 99, can comprise a metal such as gold. Alternatively, the electrodes 96, 98 and 99 can comprise a conductive polymer such as polythiophene or polyaniline, a printed conductor such as a polymer film comprising metal particles such as silver or nickel, a printed conductor comprising a polymer film containing graphite or some other conductive carbon material, or a conductive oxide such as tin oxide or indium tin oxide, or metal electrodes such as aluminum or gold. The dielectric layer 94, for example, can comprise a silicon dioxide layer. Alternatively, the dielectric layer 94 can comprise an insulating polymer such as polyimide and its derivatives, an inorganic oxide, an inorganic nitride such as silicon nitride, or an inorganic/organic composite material such as an organic-substituted silicon oxide, or a sol-gel organosilicon glass.

Figure 6B:
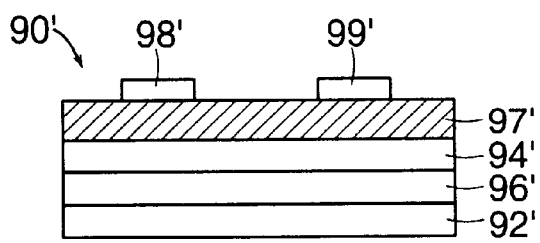
FIG. 6b shows a cross section view of an organic-based field effect transistor according to one embodiment of the present invention.

FIG. 6b provides another configuration of an organic-based field effect transistor 90'. The transistor 90' includes a substrate 92', a gate electrode 96' provided on the substrate 92', a dielectric layer 94' provided on the gate electrode 96', an organic semiconductor 97' provided on the dielectric layer 94', and a source electrode 98' and a drain electrode 99' provided on the organic semiconductor 97'. For example, the substrate 92' can comprise polyester, or some other film-based polymer. Alternatively, the substrate 92' can be a metal foil insulated from the gate electrode by a non-conducting material. The gate electrode 96' can comprise Indium Tin Oxide or a conducting polymer such as polyaniline. The dielectric layer 94' can comprise polyimide. The field effect transistor configurations provided in FIGS. 6a and 6b are exemplary only. Other transistor designs known to those skilled in the art can be used in accordance with the present invention. For example, a top gate structure in which the source and drain electrodes are placed adjacent the substrate, covered by the dielectric layer, which in turn is covered by the semiconductor and gate electrode, can also be used in accordance with the present invention.

Figure 7:
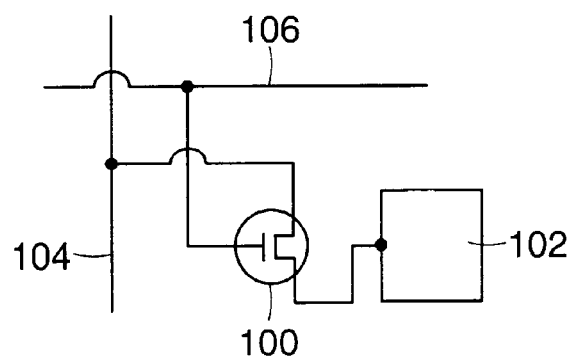
FIG. 7 illustrates connections between a transistor and electrodes of an electronic display.

Referring to FIG. 7, each transistor 100 is electrically connected to a pixel electrode 102, a column electrode 104, and a row electrode 106. The pixel electrode 102 is connected to the drain of the transistor 100. The column electrode 104 is connected to the source of the transistor 100. The row electrode 106 is connected to the gate of the transistor 100.

In one embodiment, transistors sharing a common gate electrode are activated. The conductive substrate can be patterned such that a voltage is applied to the transistors in a common row or a common column only. Alternatively, if the transistors are spaced far enough apart or if the conductivity of the substrate is poor, than a voltage placed on the gate electrode will only provide enough voltage to activate nearby transistors.

In one embodiment, the organic semiconductor comprises a polymeric or oligomeric semiconductor. Examples of suitable polymeric semiconductors include, but are not limited to, polythiophene, poly(3-alkyl), alkyl-substituted oligothiophene, polythienylenevinylene, poly(paraphenylenevinylene) and doped versions of these polymers. An example of suitable oligomeric semiconductor is alpha-hexathienylene. Horowitz, *Organic Field-Effect Transistors*, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., *Soluble and Processable Regioregular Poly(3-hexylthiophene) for Thin Film Field-Effect Transistor Applications with High Mobility*, Appl. Phys. Lett. 69 (26), p. 4108 (December 1996). A field effect transistor made with a-hexathienylene is described in U.S. Pat. No. 5,659,181.

In another embodiment, the organic semiconductor 90, 90' comprises a carbon based compound. Examples of suitable carbon based compounds include, but are not limited to, pentacene, phthalocyanine, benzodithiophene, fullerene, buckminsterfullerene, tetracyanonaphthoquinone, and tetrakisimethylanimoethylene.

In one embodiment, the display is addressed in the following manner. While a voltage is applied to the gate electrodes on a row, different voltages are applied to each column electrode so that each pixel in that row is driven to a unique state. The characteristics of the transistors prevent pixels on other rows from responding to the column voltages. Each row electrode (gate line) is then scanned in sequence, so that an image can be built up across the entire display. In another embodiment, the electronic display comprises an irregular grouping of pixels and electrodes, rather than a regular x-y grid of electrodes and pixels.

In one embodiment, an organic-based field effect transistor is protected by a barrier layer. The barrier layer protects the transistor from air, water, light or other environmental factors to which the transistor can be sensitive. The barrier layer also protects the transistor from the solvent of the display media, if necessary. Where the solvent of the display media has a different polarity from the transistor material, contact between the solvent and the transistor may not affect the transistor properties. However, where the solvent would affect the properties of the transistor upon contact, the barrier layer segregates the solvent and the transistor. In one embodiment, the barrier layer is opaque. In one embodiment, the barrier layer comprises a metal film such as an aluminum film. In another embodiment, the barrier layer comprises a metal oxide coating such as Indium Oxide, Tin Oxide, Indium Tin Oxide, Silicon Monoxide, or Silicon Dioxide coatings. A metal film layer or a conducting oxide film layer may require additional insulating layers to prevent unwanted electrical connections between transistor components. In another embodiment, the barrier layer comprises a polymeric film containing fluorine. In another embodiment, the barrier layer comprises a polymeric film containing absorbing particles or dyes. In still another embodiment, the barrier layer comprises multiple layers of materials including metal and/or insulator. For example, the barrier layer can comprise a multi layer polymer composite film.

Figure 8:
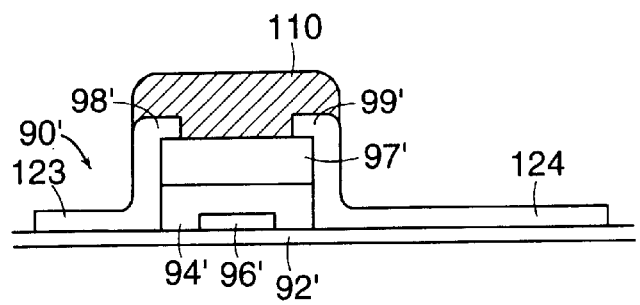
FIG. 8 shows a cross section view of an organic-based field effect transistor according to one embodiment of the present invention.
Figure 9:
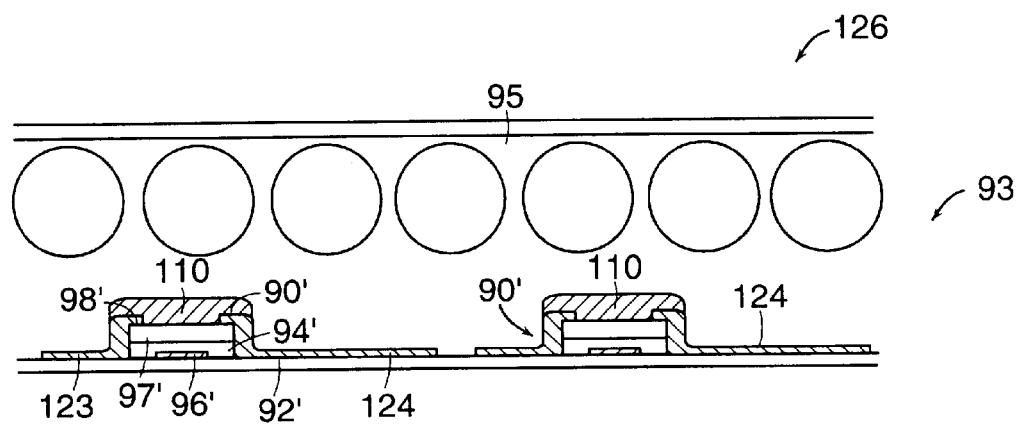
FIG. 9 shows a cross section view of an electronic display according to one embodiment of the present invention.

Referring to FIGS. 8 and 9, each transistor 90' is individually protected from the display media 93 by a barrier layer 110. Each transistor 90' is positioned adjacent a pixel electrode 124 on a substrate 92'. The column electrode 123, and the row electrode (not shown) are also provided on the substrate 92'. The barrier layer 110 is positioned over at least the semiconductor layer 97' of the transistor 90' which would otherwise be exposed to the display media 93. Alternatively, the barrier layer 110 can protect the entire transistor 90'. The source electrode 98' is connected to the column electrode 123. The drain electrode 99' is connected to the pixel electrode 124. The gate electrode 96' is connected to the row electrode (not shown).

Figure 10:
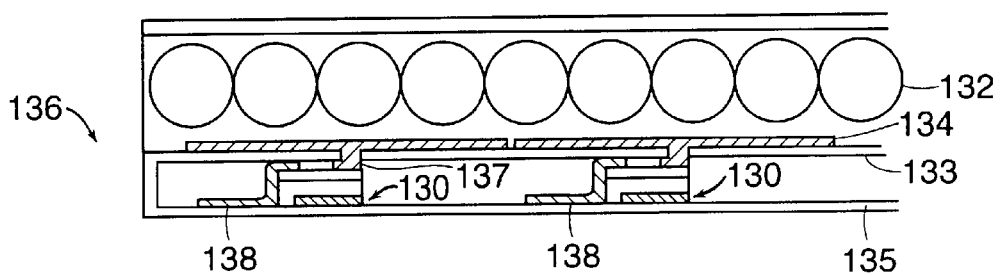
FIG. 10 shows a cross section view of an electronic display according to one embodiment of the present invention.

Referring to FIG. 10, an array of transistors 130 are protected from the display media 132 with a first barrier layer 133. The array of transistors 130 are positioned on a substrate and placed underneath the pixel electrodes 134. The substrate 135 also functions as a second barrier layer, protecting the transistors 130 from the environment. The edges of the first barrier layer 133 and the second barrier layer are sealed, thereby forming a barrier capsule 136 encapsulating the array of transistors 130. The barrier capsule 136 also encapsulates the column electrodes 138 and the row electrodes (not shown). The first barrier layer 133 includes a plurality of vias for providing an electrical contact between a transistor 130 and its adjacent pixel electrode 134. The vias can be made by etching the first barrier layer 133 to provide a plurality of opening and providing a conductive material inside the openings, thereby providing electrical contact between the drain electrode 137 of the transistor 130 and the pixel electrode 134.

An electronic display comprising a microencapsulated particle-based display media and an organic-based field effect transistor offer numerous advantages.

First, the display can be made inexpensively using a simple manufacturing process. For example, both the organic-based field effect transistor and the display media can be printed. Commonly owned U.S. patent application Ser. No. 09/140,856 filed on Aug. 27, 1998, incorporated herein by reference, describes an electronic display which is printed in its entirety. Since the entire display can be printed, the display can be made large. The display can possess a large number of pixels addressed in a row and column (also known as XY) addressing scheme. The display can also be made using flexible substrates.

Second, the performance requirements for the organic-based field effect transistor when used in this particle-based display is not stringent. Because of low current requirements of the particle-based encapsulated display media, transistors having moderate performance characteristic (i.e., transistor mobility of less than $10^{-3} cm^2/Vs$) can be suitable for driving such display.

Third, since a microencapsulated particle-based display is truly reflective, the underlying substrate need not be transparent. This offers significant design advantages for the combination of organic-based transistors and microencapsulated particle-based displays. For example, the transistor can be as large as the pixel itself.

Fourth, since the microencapsulated particle-based electrophoretic display can be bistable and require updating only occasionally, the organic transistor need not address the display continuously, which will extend the life of the transistor.

Fifth, a microencapsulated particle-based display media prevents fluid from the display media from coming in contact with the transistor device, and provides additional stability for the transistor.

In one embodiment, a display is created by printing the entire display or a portion of the display. The term "printing"

is intended to include all forms of printing and coating, including: premetered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques.

In one embodiment, the display is manufactured by providing conductive coatings to form column electrodes, row electrodes, and pixel electrodes on a substrate, providing organic-based transistors on the substrate, printing an electronic ink comprising a plurality of encapsulated display media on the substrate, and printing a second conductive coating on the electronic ink. The conductive coatings can be provided by printing, evaporation, or sputtering, or using any other suitable method known to those skilled in the art. The conductive coatings may be Indium Tin Oxide (ITO) or some other suitable conductive material. The conductive coatings may be applied from a vaporous phase, by electrolytic reaction, or deposition from a dispersed state such as spray droplets or dispersions in liquids. The conductive coatings need not be the same conductive material. Printable electrode structures for displays are described in commonly owned U.S. patent application Ser. No. 09/141,103, filed on Aug. 27, 1998, incorporated herein by reference. In one embodiment, the substrate is a polyester sheet. The electronic ink can be printed in a variety of ways including screen printing, ink jet printing, and deposition. Details of these printing methods are described in commonly owned U.S. patent application Ser. No. 08/935,800 filed on Sep. 23, 1997, incorporated herein by reference.

In one embodiment, the organic-based transistor is also printed in its entirety. For example, an organic-based transistor comprising electrodes based on ITO or polymeric conductor, a polymeric dielectric layer, and a polymeric semiconductor can be fabricated by printing. Bao et al., *High-Performance Plastic Transistors Fabricated by Printing Techniques*, Chem. Mater. 1997, 9, 1299–1301 describes an organic-based transistor made by printing. In one embodiment, an organic semiconductor of the organic transistor can be made using a solvent-assisted printing step. In this embodiment, the polymer material to be printed is dissolved in a solvent, and the solution containing the polymer and the solvent is printed on the electrode. Subsequently, the solvent evaporates and leaves behind the polymer material. The solvent may evaporate at room temperature or at an elevated temperature, under vacuum, under exposure to a stream of air, or a combination of the above.

In another embodiment, the organic-based transistor is fabricated using a combination of a variety of methods. For example, the organic semiconductor layer can be provided using evaporation. In evaporation, the material to be deposited is typically placed in a container and is heated under reduced pressure, vaporizing the molecules. The vaporized molecules strike a substrate and forms a coating on the substrate. The electrodes and leads of the transistor can be fabricated by printing, coating, evaporation, and/or photolithography. Likewise, the dielectric layer can be fabricated using any of the above described methods.

In another embodiment, the organic transistor is protected by a barrier layer. The transistor can be protected by coating the transistor with a film comprising the barrier layer material. For example, the barrier layer can comprises a metal film, a metal oxide coating or a polymeric film. Alternatively, the transistor can be protected by laminating the transistor and the barrier layer, printing the barrier layer on the transistors, solvent coating the barrier layer on the transistors, or evaporating or sputtering the barrier layer on the transistors. In still another embodiment, an array of organic-based transistors can be encapsulated in a barrier capsule. The barrier capsule can be formed by providing a first barrier layer over the transistors, a second barrier layer under the transistors, and sealing the edges of the first and second barrier layers. The first barrier layer can be printed, coated, evaporated or sputtered on the transistors. The second barrier layer can comprise a substrate on which the transistors are formed. Other suitable methods known to those skilled in the art can be used to encapsulate the organic-based transistors in a barrier capsule. These various methods are well known to those skilled in the art.

In another embodiment, the organic-based transistors are fabricated on a first substrate, and the electronic ink is fabricated on a second substrate. Subsequently, the two substrates are laminated together to form a display device.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A display comprising:
   an encapsulated display medium comprising a plurality of capsules each of which comprises at least one particle and a fluid, the display medium having a first surface and an opposed second surface, the display providing an image for viewing via one of the first and second surfaces; and
   an organic-based field effect transistor comprising an organic semiconductor, the organic-based field effect transistor disposed on the second surface of the display medium so as to be capable of addressing the display medium.

2. The display of claim 1 wherein the first surface displays an image or an alphanumeric character.

3. The display of claim 1 further comprising a substrate, and wherein the display medium is printed on the substrate.

4. The display of claim 1 wherein the at least one particle is an electrophoretic particle.

5. The display of claim 1 wherein the at least one particle is a rotating ball.

6. The display of claim 1 wherein the organic semiconductor comprises a polymeric semiconductor.

7. The display of claim 6 wherein the polymeric semiconductor comprises polythiophene.

8. The display of claim 7 wherein the polymeric semiconductor comprises poly(3-alkyl)thiophene.

9. The display of claim 6 wherein the polymeric semiconductor comprises an alkyl-substituted oligothiophene.

10. The display of claim 1 wherein the organic semiconductor comprises alpha-hexathienylene.

11. The display of claim 1 wherein the organic semiconductor is selected from a group consisting of pentacene, phthalocyanine, benzodithiophene, fullerene, buckminsterfullerene, tetracyanonaphthoquinone, and tetrakisimethylanimoethylene.

12. The display of claim 6 wherein the polymeric semiconductor comprises polythienylenevinylene.

13. The display of claim 6 wherein the polymeric semiconductor comprises poly(para-phenylenevinylene).

14. The display of claim 1 wherein the organic semiconductor comprises an oligomeric semiconductor.

15. A display comprising:
an encapsulated display medium comprising a plurality of capsules each of which comprises at least one particle and a fluid, the display medium having a first surface and an opposed second surface, the display providing an image for viewing via one of the first and second surfaces;
an organic-based field effect transistor comprising an organic semiconductor, the organic-based field effect transistor disposed adjacent the second surface of the display medium so as to be capable of addressing the display medium; and
a barrier layer disposed between the encapsulated display medium and the organic-based field effect transistor.

16. The display of claim 15 further comprising a plurality of pixel electrodes disposed adjacent the second surface of the display medium and a plurality of organic-based field effect transistors, each one of the transistors protected with the barrier layer disposed between the encapsulated display medium and the plurality of transistors.

17. The display of claim 16 wherein each one of the organic-based field effect transistors is encapsulated in a barrier capsule and disposed adjacent the second surface of the display medium such that each one of the plurality of transistors is disposed adjacent one each of the plurality of pixel electrodes and drives the electrode.

18. The display of claim 15 wherein the barrier layer comprises a metal film.

19. The display of claim 15 wherein the barrier layer comprises a metal oxide coating.

20. The display of claim 15 wherein the barrier layer comprises a polymeric coating.

21. The display of claim 15 wherein the barrier layer comprises a material capable of protecting the transistor from light.

22. The display of claim 21 wherein the light comprises at least one of visible or ultraviolet light.

23. The display of claim 15 wherein the barrier layer comprises a material capable of protecting the transistor from the display medium.

24. The display of claim 15 wherein the barrier layer comprises a material capable of protecting the transistor from oxygen.

25. The display of claim 15 wherein the barrier layer comprises a material capable of protecting the transistor from moisture.

26. The display of claim 17 wherein the barrier capsule comprises a plurality of vias providing electrical contact between each transistor and the adjacent pixel electrode.

27. The display of claim 1 wherein the organic-based field effect transistor is disposed on an opaque substrate.

28. The display of claim 1 wherein the organic-based field effect transistor is disposed on a substrate comprising a material capable of protecting the transistor from oxygen.

29. The display of claim 1 wherein the organic-based field effect transistor is disposed on a substrate comprising a material capable of protecting the transistor from moisture.

30. A method of manufacturing a display comprising the steps of:
(c) providing an encapsulated display medium comprising a plurality of capsules each of which comprises at least one particle and a fluid, the display medium having a first surface and an opposed second surface, the display providing an image for viewing via one of the first and second surfaces; and
(d) providing an organic-based field effect transistor array comprising an organic semiconductor and disposed on the second surface of the display medium so as to be capable of addressing the display medium.

31. The method of claim 30 wherein step a) comprises providing an encapsulated display media on a first substrate; and step b) comprises (b1) providing an organic-based field effect transistor array on a second substrate, and (b2) combining the display media and the organic-based field effect transistor array to form the display.

32. The method of claim 30 wherein step (b) comprises printing the organic-based field effect transistor array.

33. The method of claim 30 wherein step (b) comprises printing the organic-based field effect transistor array using a solvent assisted printing step.

34. The method of claim 30 wherein step (a) comprises providing a display medium comprising microencapsulated electrophoretic particles.

35. The method of claim 30 wherein step (a) comprises providing a display medium comprising microencapsulated suspended particles.

36. The method of claim 30 wherein step (a) comprises providing a display medium comprising microencapsulated rotating balls.

37. The method of claim 30 wherein step (a) comprises providing a substrate and printing the display medium on the substrate.

38. The method of claim 30 wherein step (b) comprises providing an organic-based field effect transistor array comprising a polymeric semiconductor.

39. The method of claim 30 wherein step (b) comprises providing an organic-based field effect transistor array comprising alkyl-substituted oligothiophene.

40. The method of claim 30 wherein step (b) comprises providing an organic-based field effect transistor array comprising alpha-hexathienyl.

41. The method of claim 30 wherein step (b) comprises providing an organic-based field effect transistor array comprising an organic semiconductor selected from a group consisting of pentacene, phthalocyanine, benzodithiophene, fullerene, buckminsterfullerene, tetracyanonapththoquinone, and tetrakisimethylanimoethylene.

42. The method of claim 38 wherein step (b) comprises providing an organic-based field effect transistor array comprising polythienylenevinylene.

43. The method of claim 38 wherein step (b) comprises providing an organic-based field effect transistor array comprising poly(para-phenylenevinylene).

44. A method of manufacturing a display comprising the steps of:
(a) providing an encapsulated display medium comprising a plurality of capsules each of which comprises at least one particle and a fluid, the display medium having a first surface and an opposed second surface, the display providing an image for viewing via one of the first and second surfaces;
(b) providing an organic-based field effect transistor array; and
(c) providing a barrier layer disposed between each organic-based field effect transistor of the array and the encapsulated display medium to protect the transistor.

45. The method of claim 44 wherein step (c) comprises providing a barrier layer which protects the transistor array from light.

46. The method of claim 44 wherein step (c) comprises providing a barrier layer which protects the transistor array from moisture.

47. The method of claim 44 wherein step (c) comprises providing a barrier layer which protects the transistor array from oxygen.

48. The method of claim 30 wherein step (b) comprises providing an organic-based transistor array by evaporating the organic semiconductor of at least one transistor of the array.

49. The method of claim 30 wherein step (b) comprises providing an organic-based transistor array by solvent coating an insulator of at least one transistor of the array.

50. The method of claim 30 wherein step (b) comprises providing an organic-based transistor array by evaporating conductive leads of at least one transistor of the array.

51. The method of claim 30 wherein step (b) comprises providing an organic-based transistor array by solvent coating at least one of a gate electrode, a source electrode, and a drain electrode of at least one transistor of the array.

52. The method of claim 30 wherein step (b) comprises providing an organic-based transistor array by evaporating at least one of the organic semiconductor and an insulator of at least one transistor of the array.

53. The method of claim 30 wherein step (b) comprises providing an organic-based transistor array by sputtering at least one of a gate electrode, a source electrode, a drain electrode, an insulator, and the organic semiconductor of at least one transistor of the array.

54. The method of claim 30 wherein step (b) comprises providing an organic-based field effect transistor array comprising an oligomeric semiconductor.

55. A display comprising:

an encapsulated display medium comprising a plurality of capsules each of which comprises at least one particle and a fluid, the display medium having a first surface and an opposed second surface, the display providing an image for viewing via one of the first and second surfaces;

an organic-based field effect transistor comprising an organic semiconductor, the organic-based field effect transistor disposed adjacent the second surface of the display medium so as to be capable of addressing the display medium; and a pixel electrode disposed between the encapsulated display medium and the organic-based field effect transistor.

* * * * *

UNITED STATES PATENT AND TRADEMARK OFFICE
CERTIFICATE OF CORRECTION

PATENT NO. : 6,518,949 B2 Page 1 of 1
DATED : February 11, 2003
INVENTOR(S) : Drzaic It is certified that error appears in the above-identified patent and that said Letters Patent is hereby corrected as shown below:

<u>Column 13,</u>
Line 60, please delete "(c)" and insert in its place -- (a) --.
Line 66, please delete "(d)" and insert in its place -- (b) --.

Signed and Sealed this

Thirteenth Day of April, 2004

JON W. DUDAS
*Acting Director of the United States Patent and Trademark Office*